United States Patent
Apostolo et al.

(10) Patent No.: US 10,696,768 B2
(45) Date of Patent: *Jun. 30, 2020

(54) CROSSLINKABLE FLUOROPOLYMERS

(71) Applicant: SOLVAY SPECIALTY POLYMERS ITALY S.P.A., Bollate (IT)

(72) Inventors: Marco Apostolo, Senago (IT); Francesco Maria Triulzi, Garbagnate Milanese (IT); Paula Cojocaru, Legnano (IT); Ivan Wlassics, Garessio (IT); Giuseppe Marchionni, Milan (IT); Claudio Adolfo Pietro Tonelli, Paderno d'adda (IT)

(73) Assignee: SOLVAY SPECIALITY POLYMERS ITALY S.P.A., Bollate (Milan) (IT)

( * ) Notice: Subject to any disclaimer, the term of this patent is extended or adjusted under 35 U.S.C. 154(b) by 0 days.

This patent is subject to a terminal disclaimer.

(21) Appl. No.: 15/121,266

(22) PCT Filed: Feb. 25, 2015

(86) PCT No.: PCT/EP2015/053873
§ 371 (c)(1),
(2) Date: Aug. 24, 2016

(87) PCT Pub. No.: WO2015/128339
PCT Pub. Date: Sep. 3, 2015

(65) Prior Publication Data
US 2016/0362512 A1    Dec. 15, 2016

(30) Foreign Application Priority Data
Feb. 28, 2014   (EP) ..................................... 14157171

(51) Int. Cl.
| | | |
|---|---|---|
| A61L 9/04 | (2006.01) |
| A61K 8/00 | (2006.01) |
| C08F 214/22 | (2006.01) |
| C08J 3/24 | (2006.01) |
| C08J 3/28 | (2006.01) |
| H01L 31/048 | (2014.01) |
| C08F 214/18 | (2006.01) |
| C08J 5/18 | (2006.01) |

(52) U.S. Cl.
CPC ........ *C08F 214/225* (2013.01); *C08F 214/18* (2013.01); *C08F 214/186* (2013.01); *C08F 214/22* (2013.01); *C08J 3/24* (2013.01); *C08J 3/28* (2013.01); *C08J 5/18* (2013.01); *H01L 31/0481* (2013.01); *C08J 2327/08* (2013.01); *Y02E 10/50* (2013.01)

(58) Field of Classification Search
CPC .... C08F 259/08; C08F 214/22; C08F 299/00; C08J 3/246; C08J 3/247; C08J 3/28; C08J 2351/00; C08J 2333/08
USPC ........... 522/39, 33, 6, 1, 71, 189, 184; 520/1
See application file for complete search history.

(56) References Cited

U.S. PATENT DOCUMENTS

| | | |
|---|---|---|
| 4,990,283 A | 2/1991 | Visca et al. |
| 5,498,680 A | 3/1996 | Abusleme et al. |
| 6,103,843 A | 8/2000 | Abusleme et al. |
| 6,680,357 B1 | 1/2004 | Hedhli et al. |
| 9,267,015 B2 | 2/2016 | Marion et al. |
| 9,284,262 B2 | 3/2016 | Vidal et al. |
| 2011/0166025 A1 | 7/2011 | Jentzer et al. |
| 2016/0369028 A1* | 12/2016 | Tonelli ................. C08F 214/18 |

FOREIGN PATENT DOCUMENTS

| | | | |
|---|---|---|---|
| JP | 2000-215917 A | 8/2000 | |
| WO | 2007101929 A1 | 9/2007 | |
| WO | WO-2008129041 A1 * | 10/2008 | ............ B01D 69/02 |
| WO | 2011058016 A1 | 5/2011 | |
| WO | 2011154661 A1 | 12/2011 | |
| WO | 2012084579 A1 | 6/2012 | |
| WO | WO-2012084579 A1 * | 6/2012 | ............ C08F 214/22 |
| WO | 2012-175416 | * 12/2012 | |
| WO | 2013072216 A1 | 5/2013 | |
| WO | 2013160240 A1 | 10/2013 | |
| WO | 2014023593 A1 | 2/2014 | |

* cited by examiner

*Primary Examiner* — Jessica Whiteley

(57) ABSTRACT

The present invention pertains to a process for the manufacture of a crosslinkable fluoropolymer, to said crosslinkable fluoropolymer and the crosslinked fluoropolymer obtainable therefrom, to a film comprising said crosslinkable fluoropolymer or said crosslinked fluoropolymer and to uses of said crosslinked fluoropolymer film in various applications.

20 Claims, No Drawings

CROSSLINKABLE FLUOROPOLYMERS

This application is a U.S. national stage entry under 35 U.S.C. §371 of International Application No. PCT/EP2015/053873 filed Feb. 25, 2015, which claims priority to European application No. 14157171.1 filed on Feb. 28, 2014. The entire contents of these applications are explicitly incorporated herein by this reference.

TECHNICAL FIELD

The present invention pertains to a process for the manufacture of a crosslinkable fluoropolymer, to said crosslinkable fluoropolymer and the crosslinked fluoropolymer obtainable therefrom, to a film comprising said crosslinkable fluoropolymer or said crosslinked fluoropolymer and to uses of said crosslinked fluoropolymer film in various applications.

BACKGROUND ART

Solar panels are being intensively studied in recent years since they are able to generate clean renewable energy by photovoltaic effect without causing an increase of atmospheric carbon dioxide or other dangerous gases in the atmosphere.

The solar panel can be used as a component of a larger photovoltaic system to generate and supply electricity in commercial and residential applications.

A variety of solar panels for commercial and home appliances have been proposed.

A solar panel is typically made up of a set of solar photovoltaic modules electrically connected and mounted on a supporting structure. A photovoltaic module is a packaged interconnected assembly of solar cells.

The solar cell typically includes a substrate that can be for example made of metal or glass, a semiconductor active layer disposed on said substrate, and a transparent and/or conductive layer disposed on said semiconductor active layer.

Industrial solar cells typically comprise a semiconductor active layer made from monocrystalline silicon, polycrystalline silicon, amorphous silicon, $CuInSe_2$, $CuInS_2$, GaAs, $CdS/Cu_2S$, CdS/CdTe, CdS/InP, and $CdTe/Cu_2Te$-based multijunction material systems.

More recently other technologies are emerging in the field of photovoltaic applications, among which mention can be made of organic photovoltaics, dye-sensitized solar cells (DSSCs) and quantum dots solar cells.

In particular, dye-sensitized solar cells (DSSCs) are currently attracting great interest owing to their low production costs and high energy conversion efficiencies to be a potential alternative to conventional photovoltaic devices.

The use of fluoropolymer materials in compositions suitable for use in solar cells is already known in the art.

In particular, it is already known to use films comprising a top coat layer made of an optically transparent fluoropolymer as protective films suitable for use in solar cell modules.

A protective film is needed in a solar cell module to protect it from heat, humidity and from any possible environmental exposure or risk during transport. The protective film is typically optically transparent in order to allow the solar light to reach the solar cell module active layer.

However, fluoropolymer films known in the art have the drawback that mechanical stress on the film surface generates a haze effect that leads to a loss of the film transparency so that the operation of the solar cell is compromised. Since a solar cell module is normally exposed to a natural environment for a long time, it is mandatory that the material forming the protective film thereof has excellent hardness, abrasion resistance and impact strength so that it can protect the solar cell from any possible event (rain, hail, wind, sand, etc).

Moreover, some of the fluoropolymer protective films known in the art require either the use of adhesives or particular treatments in order to ensure their bonding to the solar cell.

Also, in several electrochemical devices such as DSSCs, optical shutters, secondary batteries and super capacitors, the presence of a liquid electrolyte triggers several problems including the leakage and evaporation of the liquid solvent, the possible desorption of the attached dyes and the corrosion of the counter electrodes, which limit the long-term performance and practical use of these devices.

Several methods have been proposed to reduce the evaporation and leakage of the liquid electrolyte by using solid or gel materials in substitution for the liquid electrolyte. The main alternatives include gel materials incorporating redox couples. However, the ion diffusion and conductivity characteristics of the solid and gel electrolytes are usually less than that of a liquid electrolyte.

SUMMARY OF INVENTION

It has been now found that by incorporation of (meth)acrylic-containing monomers into fluoropolymers it is possible to successfully manufacture (meth)acrylic-modified fluoropolymers which may be easily crosslinked into fluoropolymer networks advantageously having increased molecular weight.

It has been found that the crosslinked fluoropolymers thereby provided advantageously exhibit both enhanced chemical resistance and enhanced mechanical properties.

In a first instance, the present invention pertains to a process for the manufacture of a crosslinkable fluoropolymer [polymer (FC)], said process comprising reacting:

(A) at least one fluoropolymer [polymer (F)] comprising recurring units derived from vinylidene fluoride (VDF) and at least one functional hydrogenated monomer [monomer ($H_F$)] comprising an end group of any of formulae (I) and (II):

wherein $R_x$ is a hydrogen atom or a $C_1$-$C_5$ hydrocarbon group comprising at least one hydroxyl group, and (B) at least one (meth)acrylic compound [compound (MA)] of any of formulae (III) to (V):

wherein each of $R_1$, $R_2$ and $R_3$, equal to or different from each other, is independently a hydrogen atom or a $C_1$-$C_3$ hydrocarbon group, T is a $C_1$-$C_{10}$ hydrocarbon end group comprising at least one functional group, and Z is a bonding group of any of formulae (j) and (jj):

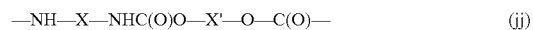

wherein X and X', equal to or different from each other, are independently hydrocarbon groups selected from the group consisting of $C_1$-$C_{20}$ aliphatic groups, $C_5$-$C_{40}$ cycloaliphatic groups and $C_6$-$C_{50}$ aromatic, alkylaromatic or heteroaromatic groups.

The process for the manufacture of a crosslinkable fluoropolymer [polymer (FC)] according to the invention advantageously comprises reacting the end group(s) of any of formulae (I) and (II) in the monomer(s) ($H_F$) of at least one polymer (F) with the functional group(s) in the end group(s) T of at least one compound (MA) of any of formulae (III) to (V).

In a second instance, the present invention pertains to the crosslinkable fluoropolymer [polymer (FC)] obtainable by the process of the invention.

The crosslinkable fluoropolymer [polymer (FC)] of the invention typically comprises recurring units derived from vinylidene fluoride (VDF) and at least one functional hydrogenated monomer [monomer (H'$_F$)] comprising a pendant side chain comprising an end group (E) of any of formulae (III-A) to (V-A):

  (III-A)

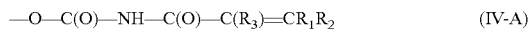  (IV-A)

  (V-A)

wherein each of $R_1$, $R_2$ and $R_3$, equal to or different from each other, is independently a hydrogen atom or a $C_1$-$C_3$ hydrocarbon group, and Z is a bonding group of any of formulae (j) and (jj):

  (j), and

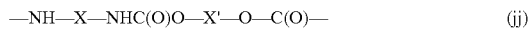  (jj)

wherein X and X', equal to or different from each other, are independently hydrocarbon groups selected from the group consisting of $C_1$-$C_{20}$ aliphatic groups, $C_5$-$C_{40}$ cycloaliphatic groups and $C_6$-$C_{50}$ aromatic, alkylaromatic or heteroaromatic groups.

In a third instance, the present invention pertains to a crosslinkable composition [composition (CC)] comprising:
  at least one crosslinkable fluoropolymer [polymer (FC)], and
  at least one additive selected from the group consisting of crosslinking co-agents and crosslinking initiators.

In a fourth instance, the present invention pertains to a process for the manufacture of a crosslinkable fluoropolymer film [film (FC)], said process comprising:
(i) providing a substrate,
(ii) providing a liquid composition [composition (L)] comprising at least one crosslinkable fluoropolymer [polymer (FC)] or the crosslinkable composition [composition (CC)], and
(iii) applying the composition (L) provided in step (ii) onto at least one surface of the substrate provided in step (i) thereby providing a film, and
(iv) optionally, drying the film provided in step (iii).

For the purpose of the present invention, the term "film" is intended to denote a flat piece of material having a thickness smaller than either of its length or its width.

The present invention thus also pertains to the crosslinkable fluoropolymer film [film (FC)] obtainable by the process of the invention.

The crosslinkable fluoropolymer film [film (FC)] typically comprises at least one crosslinkable fluoropolymer [polymer (FC)] or the crosslinkable composition [composition (CC)].

The crosslinkable fluoropolymer film [film (FC)] preferably comprises from 2% to 90% by weight, preferably from 2% to 70% by weight, more preferably from 2% to 50% by weight of at least one crosslinkable fluoropolymer [polymer (FC)] or the crosslinkable composition [composition (CC)].

For the purpose of the present invention, the term "liquid composition [composition (L)]" is intended to denote a composition comprising at least one organic solvent [solvent (S)] in the liquid state at 20° C. under atmospheric pressure.

Non-limitative examples of suitable solvents (S) include, notably, those capable of dissolving the polymer (F).

According to a first embodiment of the invention, the process for the manufacture of a crosslinkable fluoropolymer film [film (FC)] comprises:
(i-1) providing a substrate,
(ii-1) providing a liquid composition [composition (L)] comprising at least one crosslinkable fluoropolymer [polymer (FC)] or the crosslinkable composition [composition (CC)],
(iii-1) applying the composition (L) provided in step (ii-1) onto at least one surface of the substrate provided in step (i-1) thereby providing a film, and
(iv-1) drying the film provided in step (iii-1).

The crosslinkable fluoropolymer film [film (FC)] obtainable by the process of this first embodiment of the invention is typically free from any organic solvent [solvent (S)].

According to a second embodiment of the invention, the process for the manufacture of a crosslinkable fluoropolymer film [film (FC)] comprises:
(i-2) providing a substrate,
(ii-2) providing a liquid composition [composition (L)] comprising at least one crosslinkable fluoropolymer [polymer (FC)] or the crosslinkable composition [composition (CC)], and
(iii-2) applying the composition (L) provided in step (ii-2) onto at least one surface of the substrate provided in step (i-2) thereby providing a film.

The crosslinkable fluoropolymer film [film (FC)] obtainable by the process of this second embodiment of the invention typically further comprises at least one organic solvent [solvent (S)].

The crosslinkable fluoropolymer film [film (FC)] obtainable by the process of this second embodiment of the invention preferably comprises:
  from 2% to 20% by weight, with respect to the total weight of the film (FC), of at least one crosslinkable fluoropolymer [polymer (FC)] or the crosslinkable composition [composition (CC)], and
  from 80% to 98% by weight, with respect to the total weight of the film (FC), of at least one organic solvent [solvent (S)].

The choice of the substrate is not particularly limited, being understood that the film (FC) can be manufactured directly as a unitary assembly comprising said substrate or can be manufactured by applying the composition (L) onto a surface of said substrate, from which said film (FC) can be detached and individualized.

The substrate may be a monolayer or a multilayer substrate wherein the outer layer is made from a material selected from the group consisting of glass, polymers and metals.

In a fifth instance, the present invention pertains to a process for the manufacture of a crosslinked fluoropolymer film [film (FCC)], said process comprising crosslinking the crosslinkable fluoropolymer film [film (FC)].

The present invention thus further pertains to the crosslinked fluoropolymer film [film (FCC)] obtainable by the process of the invention.

The crosslinked fluoropolymer film [film (FCC)] typically comprises at least one crosslinked fluoropolymer [polymer (FCC)].

The crosslinked fluoropolymer film [film (FCC)] is advantageously obtainable by crosslinking the pendant side chains of the polymer (FC).

The crosslinked fluoropolymer [polymer (FCC)] typically comprises one or more fluoropolymer domains consisting of fluoropolymer chains obtainable by the polymer (FC) and one or more hydrocarbon domains consisting of hydrocarbon chains obtainable by crosslinking the pendant side chains of the polymer (FC).

Determination of the crosslinking density of the crosslinked fluoropolymer film [film (FCC)] of the present invention can be performed by any suitable method. The crosslinked fluoropolymer film [film (FCC)] is typically swelled in a suitable solvent at a specific temperature and either the change in mass or the change in volume is measured. The more the crosslinking density of the crosslinked fluoropolymer film [film (FCC)], the more swelling of the crosslinked fluoropolymer film [film (FCC)] in said solvent.

According to a first embodiment of the invention, the process for the manufacture of a crosslinked fluoropolymer film [film (FCC)] comprises:
(i-1) providing a substrate,
(ii-1) providing a liquid composition [composition (L)] comprising at least one crosslinkable fluoropolymer [polymer (FC)] or the crosslinkable composition [composition (CC)],
(iii-1) applying the composition (L) provided in step (ii-1) onto at least one surface of the substrate provided in step (i-1) thereby providing a film,
(iv-1) drying the film provided in step (iii-1), and
(v-1) crosslinking the film provided in step (iv-1).

The crosslinked fluoropolymer film [film (FCC)] obtainable by the process of this first embodiment of the invention is typically free from any organic solvent [solvent (S)].

According to a second embodiment of the invention, the process for the manufacture of a crosslinked fluoropolymer film [film (FCC)] comprises:
(i-2) providing a substrate,
(ii-2) providing a liquid composition [composition (L)] comprising at least one crosslinkable fluoropolymer [polymer (FC)] or the crosslinkable composition [composition (CC)],
(iii-2) applying the composition (L) provided in step (ii-2) onto at least one surface of the substrate provided in step (i-2) thereby providing a film, and
(iv-2) crosslinking the film provided in step (iii-2).

The crosslinked fluoropolymer film [film (FCC)] obtainable by the process of this second embodiment of the invention typically further comprises at least one organic solvent [solvent (S)].

The crosslinked fluoropolymer film [film (FCC)] of the invention is particularly suitable for use in a solar cell module.

According to a preferred embodiment of the process of the invention, under step (i) of the process of the invention the substrate is a photovoltaic module.

In a sixth instance, the present invention thus pertains to a process for the manufacture of a solar cell module, said process comprising:

(i') providing a photovoltaic module,
(ii') providing a liquid composition [composition (L)] comprising at least one crosslinkable fluoropolymer [polymer (FC)] or the crosslinkable composition [composition (CC)],
(iii') applying the composition (L) provided in step (ii') onto at least one surface of the photovoltaic module provided in step (i') thereby providing a film,
(iv') optionally, drying the film provided in step (iii'), and
(v') crosslinking the film provided in either step (iii') or in step (iv').

The solvent (S) is preferably selected from the group consisting of:
(a) diesters of formula (DE-I) and ester-amides of formula (EA-I):

$$R_A\text{—OOC—}Z_{de}\text{—COO—}R_B \quad \text{(DE-I)}$$

$$R_A\text{—OOC—}Z_{ea}\text{—CO—}NR_CR_D \quad \text{(EA-I)}$$

wherein:
$R_A$ and $R_B$, equal to or different from each other, are independently selected from the group consisting of $C_1$-$C_{20}$ hydrocarbon groups,
$R_C$ and $R_D$, equal to or different from each other, are independently selected from the group consisting of hydrogen, $C_1$-$C_{36}$ hydrocarbon groups, possibly substituted, being understood that $R_C$ and $R_D$ might be part of a cyclic moiety including the nitrogen atom to which they are bound, said cyclic moiety being possibly substituted and/or possibly comprising one or more than one additional heteroatom, and mixtures thereof, and
$Z_{de}$ and $Z_{ea}$, equal to or different from each other, are independently a linear or branched $C_3$-$C_{10}$ divalent alkylene group;
(b) aliphatic, cycloaliphatic or aromatic ether oxides, more particularly, diethyl oxide, dipropyl oxide, diisopropyl oxide, dibutyl oxide, methyltertiobutylether, dipentyl oxide, diisopentyl oxide, ethylene glycol dimethyl ether, ethylene glycol diethyl ether, ethylene glycol dibutyl ether benzyl oxide; dioxane, tetrahydrofuran (THF);
(c) glycol ethers such as ethylene glycol monomethyl ether, ethylene glycol monoethyl ether, ethylene glycol monopropyl ether, ethylene glycol monoisopropyl ether, ethylene glycol monobutyl ether, ethylene glycol monophenyl ether, ethylene glycol monobenzyl ether, diethylene glycol monomethyl ether, diethylene glycol monoethyl ether, diethylene glycol mono-n-butyl ether;
(d) glycol ether esters such as ethylene glycol methyl ether acetate, ethylene glycol monoethyl ether acetate, ethylene glycol monobutyl ether acetate, propylene glycol monomethyl ether acetate;
(e) alcohols such as methyl alcohol, ethyl alcohol, diacetone alcohol;
(f) ketones such as acetone, methylethylketone, methylisobutyl ketone, diisobutylketone, cyclopentanone, cyclohexanone, isophorone, and
(g) linear or cyclic esters such as isopropyl acetate, n-butyl acetate, methyl acetoacetate, dimethyl phthalate, g-butyrolactone;
(h) linear or cyclic amides such as N,N-diethylacetamide, N,N-dimethylacetamide, dimethylformamide and N-methyl-2-pyrrolidone; and
(i) dimethyl sulfoxide.

The solvent (S) is more preferably selected from the group consisting of diesters of formula (DE-I) and ester-amides of formula (EA-I) as defined above.

In formulae (DE-I) and (EA-I), $R_A$ and $R_B$, equal to or different from each other, are preferably selected from the group consisting of $C_1$-$C_{20}$ alkyl, $C_1$-$C_{20}$ aryl, $C_1$-$C_{20}$ alkyaryl, $C_1$-$C_{20}$ arylalkyl groups, and mixtures thereof.

The expression "$C_1$-$C_{20}$ alkyl" is used according to its usual meaning and it encompasses notably linear, cyclic, branched saturated hydrocarbon chain having from 1 to 20 carbon atoms and preferably from 1 or 2 to 10 carbon atoms.

The expression "$C_1$-$C_{20}$ aryl" is used according to its usual meaning and it encompasses notably aromatic mono- or poly-cyclic groups, preferably mono- or bi-cyclic groups, comprising from 6 to 12 carbon atoms, preferably phenyl or naphthyl groups.

The expression "$C_1$-$C_{20}$ arylalkyl" is used according to its usual meaning and it encompasses linear, branched or cyclic saturated hydrocarbon groups comprising, as substituent, one or more than one aromatic mono- or poly-cyclic groups, such as, notably benzyl group.

The expression "$C_1$-$C_{20}$ alkylaryl" is used according to its usual meaning and it encompasses aromatic mono- or polycyclic groups comprising, as substituent, one or more than one alkyl groups, e.g. one or more than one linear, cyclic, branched saturated hydrocarbon chain having from 1 to 14 carbon atoms and preferably from 1 or 2 to 10 carbon atoms.

In formulae (DE-I) and (EA-I), $R_A$ and $R_B$, equal to or different from each other, are preferably selected from the group consisting of methyl, ethyl, n-propyl, isopropyl, n-butyl, isobutyl, terbutyl, sec-butyl, 2-ethyl-butyl, n-pentyl, isopentyl, sec-pentyl, cyclopentyl, n-hexyl, isohexyl, sec-hexyl, 2-ethylhexyl, sec-heptyl, 3-methyl-hexyl, 4-methyl-hexyl, 1-ethyl-pentyl, 2-ethyl-pentyl, 3-ethyl-pentyl, n-octyl, isooctyl, 3-methyl-heptyl, n-nonyl, n-decyl, n-undecyl, n-dodecyl, n-tridecyl, n-tetradecyl, n-pentadecyl, cyclohexyl, phenyl and benzyl groups.

In formula (EA-I), $R_C$ and $R_D$, equal to or different from each other, are preferably selected from the group consisting of $C_1$-$C_{20}$ alkyl, $C_1$-$C_{20}$ aryl, $C_1$-$C_{20}$ alkyaryl, $C_1$-$C_{20}$ arylalkyl groups, all said groups possibly comprising one or more than one substituents, possibly having one or more than one heteroatoms, and of cyclic moieties comprising both $R_C$ and $R_D$ and the nitrogen atom to which they are bound, said cyclic moieties possibly comprising one or more than one heteroatoms, e.g. an oxygen atom or an additional nitrogen atom.

In formula (EA-I), $R_C$ and $R_D$, equal to or different from each other, are more preferably selected from the group consisting of methyl, ethyl, hydroxyethyl, n-propyl, isopropyl, n-butyl, isobutyl, terbutyl, n-pentyl, isopentyl, hexyl and cyclohexyl groups, most preferably from the group consisting of methyl, ethyl and hydroxyethyl groups.

According to a first embodiment of the invention, $Z_{de}$ in formula (DE-I) and $Z_{ea}$ in formula (EA-I) are branched $C_3$-$C_{10}$ divalent alkylene groups.

According to this first embodiment, $Z_{de}$ in formula (DE-I) and $Z_{ea}$ in formula (EA-I) are preferably selected from the group consisting of:
  $Z_{MG}$ groups of formula $MG_a$-CH(CH$_3$)—CH$_2$—CH$_2$— or $MG_b$-CH$_2$—CH$_2$—CH(CH$_3$)—,
  $Z_{ES}$ groups of formula $ES_a$-CH(C$_2$H$_5$)—CH$_2$—, or $ES_b$-CH$_2$—CH(C$_2$H$_5$)—, and
  mixtures thereof.

According to a variant of this first embodiment, the composition (L) comprises:
(a') at least one diester of formula (DE-I'), at least one diester of formula (DE-I") and, optionally, at least one diester of formula (DE-I'''); or
(b') at least one ester-amide of formula (EA-I'), at least one ester-amide of formula (EA-I") and, optionally, at least one ester-amide of formula (EA-I);

or
(c') combinations of (a') and (b'),
wherein:
  (DE-I') is $R_A$—OOC—$Z_{MG}$—COO—$R_B$
  (EA-I') is $R_A$—OOC—$Z_{MG}$—CO—NR$_C$R$_D$
  (DE-I") is $R_A$—OOC—$Z_{ES}$—COO—$R_B$
  (EA-I") is $R_A$—OOC—$Z_{ES}$—CO—NR$_C$R$_D$; and
  (DE-I''') is $R_A$—OOC—(CH$_2$)$_4$—COO—$R_B$,
wherein:
  $Z_{MG}$ is of formula $MG_a$-CH(CH$_3$)—CH$_2$—CH$_2$— or $MG_b$-CH$_2$—CH$_2$—CH(CH$_3$)—,
  $Z_{ES}$ is of formula $ES_a$-CH(C$_2$H$_5$)—CH$_2$—, or $ES_b$—CH$_2$—CH(C$_2$H$_5$)—; and
wherein $R_A$ and $R_B$, equal to or different from each other, are independently selected from the group consisting of $C_1$-$C_{20}$ alkyl, $C_1$-$C_{20}$ aryl, $C_1$-$C_{20}$ alkyaryl, $C_1$-$C_{20}$ arylalkyl groups;
  $R_C$ and $R_D$, equal to or different from each other, are selected from the group consisting of $C_1$-$C_{20}$ alkyl, $C_1$-$C_{20}$ aryl, $C_1$-$C_{20}$ alkyaryl, $C_1$-$C_{20}$ arylalkyl groups, all said groups possibly comprising one or more than one substituent, possibly having one or more than one heteroatoms, and of cyclic moieties comprising both $R_C$ and $R_D$ and the nitrogen atom to which they are bound, said cyclic moieties possibly comprising one or more than one heteroatoms, e.g. an oxygen atom or an additional nitrogen atom.

In above mentioned formulae (DE-I'), (DE-I"), (DE-I'''), (EA-I), (EA-I') and (EA-I"), $R_A$ and $R_B$ are preferably methyl groups, while $R_C$ and $R_D$, equal to or different from each other, are preferably selected from the group consisting of methyl, ethyl and hydroxyethyl groups.

According to this variant, the composition (L) may comprise:
(y) a diester mixture consisting essentially of:
  from 70% to 95% by weight of diester of formula (DE-I'),
  from 5% to 30% by weight of diester of formula (DE-I"), and
  from 0 to 10% by weight of diester of formula (DE-I'''), as defined above; or
(yy) an ester-amide mixture consisting essentially of:
  from 70% to 95% by weight of ester-amide of formula (EA-I'),
  from 5% to 30% by weight of ester-amide of formula (EA-I"), and
  from 0 to 10% by weight of ester-amide of formula (EA-I), as defined above; or
(yyy) mixtures of (y) and (yy), as defined above.

Non-limitative examples of useful diester-based mixtures wherein $Z_{de}$ in formula (DE-I) and/or $Z_{ea}$ in formula (EA-I) is branched are commercially available under the trademark name RHODIASOLV® IRIS.

RHODIASOLV® IRIS solvent is a mixture of diesters comprising essentially (more than 80% by weight) of dimethyl ethylsuccinate and dimethyl 2-methylglutarate.

According to a second embodiment of the invention, $Z_{de}$ in formula (DE-I) and $Z_{ea}$ in formula (EA-I) are $C_3$-$C_{10}$ linear divalent alkylene groups.

According to a variant of this second embodiment, the composition (L) comprises:
(k) at least one diester of formula (DE-I$^4$), at least one diester of formula
(DE-I$^3$) and at least one diester of formula (DE-I$^2$); or
(kk) at least one ester-amide of formula (EA-I$^4$), at least one ester-amide of formula (EA-I$^3$) and at least one ester-amide of formula (EA-I$^2$); or (kkk) combinations of (k) and (kk), wherein:
(DE-I$^4$) is R$_A$—OOC—(CH$_2$)$_4$—OOC—R$_B$
(DE-I$^3$) is R$_A$—OOC—(CH$_2$)$_3$—OOC—R$_B$
(DE-I$^2$) is R$_A$—OOC—(CH$_2$)$_2$—OOC—R$_B$
(EA-I$^4$) is R$_A$—OOC—(CH$_2$)$_4$—CO—NR$_C$R$_D$
(EA-I$^3$) is R$_A$—OOC—(CH$_2$)$_3$—CO—NR$_C$R$_D$
(EA-I$^2$) is R$_A$—OOC—(CH$_2$)$_2$—CO—NR$_C$R$_D$
wherein R$_A$ and R$_B$, equal to or different from each other, are independently C$_1$-C$_{20}$ alkyl, C$_1$-C$_{20}$ aryl, C$_1$-C$_{20}$ alkyaryl, C$_1$-C$_{20}$ arylalkyl groups;

R$_C$ and R$_D$, equal to or different from each other, are selected from the group consisting of C$_1$-C$_{20}$ alkyl, C$_1$-C$_{20}$ aryl, C$_1$-C$_{20}$ alkyaryl, C$_1$-C$_{20}$ arylalkyl groups, all said groups possibly comprising one or more than one substituents, possibly having one or more than one heteroatoms, and of cyclic moieties comprising both R$_C$ and R$_D$ and the nitrogen atom to which they are bound, said cyclic moieties possibly comprising one or more than one heteroatoms, e.g. an oxygen atom or an additional nitrogen atom.

In above mentioned formulae (DE-I$^4$), (DE-I$^3$), (DE-I$^2$), (EA-I$^4$), (EA-I$^3$) and (EA-I$^2$), R$_A$ and R$_B$ are preferably methyl groups, while R$_C$ and R$_D$, equal to or different from each other, are preferably selected from the group consisting of methyl, ethyl and hydroxyethyl groups.

According to certain preferred variants of this second embodiment, the composition (L) may comprise:
(I) a diester mixture consisting essentially of dimethyladipate, dimethylglutarate and dimethylsuccinate; or
(II) an ester-amide mixture consisting essentially of H$_3$COOC—(CH$_2$)$_4$—CO—N(CH$_3$)$_2$, H$_3$COOC—(CH$_2$)$_3$—CO—N(CH$_3$)$_2$, and H$_3$COOC—(CH$_2$)$_2$—CO—N(CH$_3$)$_2$; or
(III) a diester mixture of diethyladipate, diethylglutarate and diethylsuccinate; or
(IV) an ester-amide mixture consisting essentially of H$_5$C$_2$OOC—(CH$_2$)$_4$—CO—N(CH$_3$)$_2$, H$_5$C$_2$OOC—(CH$_2$)$_3$—CO—N(CH$_3$)$_2$, and H$_5$C$_2$OOC—(CH$_2$)$_2$—CO—N(CH$_3$)$_2$; or
(V) a mixture of diisobutyladipate, diisobutylglutarate and diisobutylsuccinate; or
(VI) an ester-amide mixture consisting essentially of H$_9$C$_4$OOC—(CH$_2$)$_4$—CO—N(CH$_3$)$_2$, H$_9$C$_4$OOC—(CH$_2$)$_3$—CO—N(CH$_3$)$_2$, and H$_9$C$_4$OOC—(CH$_2$)$_2$—CO—N(CH$_3$)$_2$; or
(VII) mixtures thereof.

An exemplary embodiment of the variant listed above under section (I) is a diester mixture consisting essentially of:
from 9% to 17% by weight of dimethyladipate,
from 59% to 67% by weight of dimethylglutarate, and
from 20% to 28% by weight of dimethylsuccinate.

Non-(imitative examples of useful diester-based mixtures wherein Z$_{de}$ in formula (DE-I) and/or Z$_{ea}$ in formula (EA-I) is linear are commercially available under the trademark name RHODIASOLV® RPDE.

RHODIASOLV® RPDE solvent is a mixture of diesters comprising essentially (more than 70% by weight) of dimethylglutarate and dimethylsuccinate.

Diesters of formula (DE-I) which can be used in the composition of the invention can be prepared notably according to the teachings of EP 1991519 A (RHODIA OPERATIONS) 19 Nov. 2008. Ester-amides of formula (EA-I) which can be used in the composition of the invention can be prepared notably according to the teachings of WO 2011/154661 (RHODIA OPERATIONS) 15 Dec. 2011 and US 2011/0166025 (RHODIA OPERATIONS) 7 Jul. 2011.

The composition (L) may further comprise dimethylsulfoxide (DMSO) and, optionally, one or more organic solvents (S) different from DMSO.

Should the composition (L) comprise DMSO, the weight ratio between one or more diesters of formula (DE-I) and/or one or more ester-amides of formula (EA-I) and DMSO is typically of from 1:99 to 99:1, preferably of from 20:80 to 80:20, more preferably of from 70:30 to 30:70.

Should the composition (L) further comprise one or more organic solvents (S) different from DMSO, the amount of the organic solvent(s) (S) in said composition (L) is typically lower than 50% by weight, preferably lower than 25% by weight, with respect to the total weight of the composition (L).

Under step (iii) of the process of the invention, the composition (L) is applied onto at least one surface of the substrate provided in step (i) typically by using a processing technique selected from the group consisting of casting, spray coating, roll coating, doctor blading, slot die coating, gravure coating, ink jet printing, spin coating, screen printing, brush, squeegee, foam applicator, curtain coating and vacuum coating.

Under step (iv) of the process of the invention, if any, the film provided in step (iii) is dried typically at a temperature comprised between 60° C. and 200° C., preferably at a temperature comprised between 100° C. and 180° C.

The crosslinkable fluoropolymer film [film (FC)] is typically crosslinked either by UV treatment under UV radiation or by thermal treatment.

The crosslinkable fluoropolymer film [film (FC)] is advantageously crosslinked by UV treatment under UV radiation.

For the purpose of the present invention, the term "UV radiation" is intended to denote electromagnetic radiation with a wavelength shorter than that of visible light but longer than soft X-rays. It can be subdivided into near UV (380-200 nm wavelength; abbreviation: NUV), far or vacuum UV (200-10 nm; abbreviation: FUV or VUV), and extreme UV (1-31 nm; abbreviation: EUV or XUV). NUV having a wavelength of from 200 nm to 380 nm is preferred in the process of the invention. Either monochromatic or polychromatic radiation can be used.

UV radiation can be provided in the crosslinking process of the invention by any suitable UV radiation source. Preferred UV radiation source for the process of the invention is mercury lighting. It is known that a significant portion of the energy radiated from excited mercury vapours is in the ultra-violet part of the spectrum. In the case of the low pressure discharge, more than half of the total energy supplied is radiated in the short-wave UV region at 253.7 nm. High pressure lamps radiate about 10% of their energy in the long-wave UV region at 365.0 nm, but an appreciable amount is also radiated at shorter wavelengths.

UV treatment is advantageously carried out at a temperature comprised between 0° C. and 150° C., preferably between 15° C. and 60° C.

Thermal treatment is typically carried out at a temperature comprised between 60° C. and 150° C., preferably between 100° C. and 135° C.

The crosslinkable fluoropolymer film [film (FC)] of the invention is advantageously optically transparent.

For the purpose of the present invention, by the term "optically transparent" it is meant that the crosslinkable fluoropolymer film [film (FC)] allows incident electromagnetic radiation to pass there through without being scattered.

The crosslinkable fluoropolymer film [film (FC)] is advantageously optically transparent to incident electromagnetic radiation having a wavelength of from about 100 nm to about 2500 nm, preferably of from about 400 nm to about 800 nm.

The crosslinked fluoropolymer film [film (FCC)] typically has a thickness comprised between 15 µm and 250 µm, preferably between 20 µm and 200 µm, more preferably between 25 µm and 150 µm.

The crosslinked fluoropolymer film [film (FCC)] of the invention is advantageously optically transparent.

The crosslinked fluoropolymer film [film (FCC)] is advantageously optically transparent to incident electromagnetic radiation having a wavelength of from about 100 nm to about 2500 nm, preferably of from about 400 nm to about 800 nm.

The present invention also pertains to use of at least one crosslinked fluoropolymer film [film (FCC)] as protective film in a solar cell module.

It has been found that the crosslinked fluoropolymer film [film (FCC)] of the invention advantageously ensures good transparency to light radiation, chemical and oxidative resistance, water impermeability, perfect adhesion to different substrates, and provides at the same time excellent mechanical properties to be suitably used as protective film in a solar cell module.

The present invention thus further pertains to a solar cell module comprising at least one photovoltaic module and at least one protective film as defined above.

The photovoltaic module typically comprises a semiconductor photoactive layer sandwiched between an electroconductive substrate and an optically transparent conductive layer.

For the purpose of the present invention, the term "electroconductive substrate" is intended to denote a base member for the photovoltaic module as well as a lower-side electrode. Examples of materials thereof include silicon, tantalum, molybdenum, tungsten, stainless steel, aluminium, copper, titanium, carbon sheet, lead-plated steel, and resin films, and ceramics and glass having an electroconductive layer formed thereon. On the above electroconductive substrate, a backside reflection layer may be formed from a metal layer, a metal oxide layer, or a lamination thereof. The metal layer can be formed from Ti, Cr, Mo, W, Al, Ag, Ni, Cu, and the like. The metal oxide layer can be formed from ZnO, $TiO_2$, $SnO_2$, $In_2O_3$—$SnO_2$ (ITO), and the like. The metal layer and the metal oxide layer may be formed by resistance heating vapor deposition, electron beam vapor deposition, sputtering, or like method.

For the purpose of the present invention, the term "semiconductor photoactive layer" is intended to denote a layer endowed with photoelectric conversion property and able to perform photovoltaic conversion. The specific materials used for forming such semiconductor photoactive layer include single crystal silicon semiconductor, non-single crystal silicon semiconductor (e.g. an amorphous silicon (a-Si) semiconductor or a polycrystalline silicon semiconductor), compound semiconductors and junctions such as $CuInSe_2$, $CuInS_2$, GaAs, $CdS/Cu_2S$, CdS/CdTe, CdS/InP, and $CdTe/Cu_2Te$, and organic semiconductors such as polymers and small-molecule compounds like polyphenylene vinylene, copper phthalocyanine (a blue or green organic pigment) and carbon fullerenes.

The semiconductor photoactive layer formed of either of the above semiconductor has generally a laminated structure with a "pn junction", "pin junction" or Schottky junction.

For the purpose of the present invention, the term "electroconductive layer" is intended to denote an upper-side electrode (i.e. the light receiving surface). Specific examples of materials suitable for use in the optically transparent electroconductive layer include $In_2O_3$, $SnO_2$, $In_2O_3$—$SnO_2$ (ITO), ZnO, $TiO_2$, $Cd_2SnO_4$, crystalline semiconductor layers doped with a high concentration of an impurity, like notably fluorine-doped tin oxide ($SnO_2$:F, or "FTO"), doped zinc oxide (e.g.: ZnO:Al) and flexible organic conductors, like, e.g. carbon nanotube networks embedded in a transparent polymer matrix.

The layer may be formed by resistance-heating vapor deposition, sputtering, spraying, chemical vapour deposition (CVD), impurity diffusion, and like methods. In case of flexible organic conductors, typical polymer processing technologies are also available, including laminating, casting, extrusion and the like.

A grid-type collecting electrode may be provided on the optically transparent electroconductive layer in order to efficiently collect the generated current. Specific examples of materials suitable for use in the collecting electrode include Ti, Cr, Mo, W, Al, Ag, Ni, Cu, Sn, and alloys thereof, and an electroconductive paste such as silver paste. The collecting electrode may be formed by sputtering, resistance heating, and CVD employing a mask pattern; metal film deposition and subsequent etching for patterning; direct grid electrode pattern formation by photo-assisted CVD; formation of a negative pattern mask of the grid electrode and subsequent metal plating; printing with electroconductive paste, bonding of metal wires, and like methods. The electroconductive paste generally includes a dispersion of powder of silver, gold, copper, nickel, carbon or the like in a polymeric binder. The polymeric binder includes polyester resins, epoxy resins, acrylic resins, alkyd resins, polyvinyl acetate resins, rubbers, urethane resins, and phenol resins. Otherwise, a wire made of a metal such as Cu may be provided on the transparent conductive layer.

The solar cell module is generally equipped with output terminals for extracting photovoltaic current. The output terminals are typically in electric connection with the conductive substrate and the collecting electrode, respectively. A metal piece such as a copper tab can be used as output terminal at the conductive substrate side, connected to the conductive substrate by spot welding or soldering. On the other hand, a metal may be electrically connected to the collecting electrode by means of conductive paste or solder.

The solar cell module typically further comprises a back layer.

For the purpose of the present invention, the term "back layer" is intended to denote a layer able to maintain electric insulation between the conductive substrate of the photovoltaic module and the exterior. The back layer is generally made of a flexible material which ensures sufficient electric insulation with the conductive substrate of the photovoltaic module.

A plurality of solar cell modules as defined above may be provided, wherein photovoltaic modules can be connected in series or in parallel according to the desired voltage or current.

The composition (L) may further comprise at least one electrolytic salt.

The crosslinkable fluoropolymer film [film (FC)] obtainable by the process of the invention may thus further comprise at least one electrolytic salt.

Should the composition (L) comprise at least one electrolytic salt, the film (FC) is typically obtainable by the process according to the second embodiment of the invention.

Should the composition (L) comprise at least one electrolytic salt, the film (FC) obtainable by the process of the second embodiment of the invention typically further comprises a composition (L) comprising at least one organic solvent [solvent (S)] and at least one electrolytic salt.

The crosslinked fluoropolymer film [film (FCC)] obtainable by crosslinking the film (FC) may thus also further comprise at least one electrolytic salt.

For the purpose of the present invention, the term "electrolytic salt" is hereby intended to denote a metal salt comprising electrically conductive ions.

A variety of metal salts may be employed as electrolytic salts. Metal salts which are stable and soluble in the composition (L) are generally used.

Non-limitative examples of suitable electrolytic salts include, notably, MeI, $Me(PF_6)_n$, $Me(BF_4)_n$, $Me(ClO_4)_n$, $Me(bis(oxalato)borate)_n$ ("$Me(BOB)_n$"), $MeCF_3SO_3$, $Me[N(CF_3SO_2)_2]_n$, $Me[N(C_2F_5SO_2)_2]_n$, $Me[N(CF_3SO_2)(R_FSO_2)]n$ with RF being $C_2F_5$, $C_4F_9$, $CF_3OCF_2CF_2$, $Me(AsF_6)_n$, $Me[C(CF_3SO_2)_3]_n$, $Me_2S_n$, wherein Me is a metal, preferably a transition metal, an alkaline metal or an alkaline-earth metal, more preferably Me being Li, Na, K, Cs, and n is the valence of said metal, typically n being 1 or 2, and redox electrolytes.

The electrolytic salt is preferably selected from the followings: LiI, $LiPF_6$, $LiBF_4$, $LiClO_4$, lithium bis(oxalato) borate ("LiBOB"), $LiCF_3SO_3$, $LiN(CF_3SO_2)_2$, $LiN(C_2F_5SO_2)_2$, $Me[N(CF_3SO_2)(R_FSO_2)]_n$ with $R_F$ being $C_2F_5$, $C_4F_9$, $CF_3OCF_2CF_2$, $LiAsF_6$, $LiC(CF_3SO_2)_3$, $Li_2S_n$ and combinations thereof, and redox electrolytes such as iodide/triiodide, disulfide/thiolate and tris(2,2'-bipyridine)cobalt(II/III) redox couples.

Thus, in a seventh instance, the present invention also pertains to use of at least one crosslinked fluoropolymer film [film (FCC)] further comprising at least one electrolytic salt as polymer electrolyte in an electrochemical device.

A crosslinked fluoropolymer film [film (FCC)] suitable for use as polymer electrolyte in an electrochemical device typically further comprises a composition (L) comprising at least one organic solvent [solvent (S)] and at least one electrolytic salt.

A crosslinked fluoropolymer film [film (FCC)] particularly suitable for use as polymer electrolyte in an electrochemical device preferably comprises:

from 2% to 20% by weight, with respect to the total weight of the film (FCC), of one or more fluoropolymer domains consisting of fluoropolymer chains obtainable by the polymer (FC) and one or more hydrocarbon domains consisting of hydrocarbon chains obtainable by crosslinking the pendant side chains of the polymer (FC), and from 80% to 98% by weight, with respect to the total weight of the film (FCC), of at least composition (L) comprising at least one organic solvent [solvent (S)] and at least one electrolytic salt.

The electrolytic salt is typically present in the composition (L) comprising at least one solvent (S) in a concentration of from 0.01 M to 5 M.

It has been found that the crosslinked fluoropolymer film [film (FCC)] of the invention advantageously incorporates and retains a liquid electrolyte in an effective manner during both manufacturing of the electrochemical device and operation of the same.

Non-limitative examples of suitable electrochemical devices include dye-sensitized solar cells, optical shutters, secondary batteries and capacitors.

The invention thus further pertains to a dye-sensitized solar cell comprising the polymer electrolyte as defined above.

The dye-sensitized solar cell is typically a solar cell module as defined above wherein the photovoltaic module typically comprises a front electrode made from an optically transparent conductive layer, a semiconductor photoactive layer further comprising a dye layer, the polymer electrolyte separator of the invention and a back electrode.

Non-limitative examples of suitable dyes include, notably, ruthenium and osmium-based dyes such as ruthenium tris (2,2'-bipyridyl-4,4'-dicarboxylate), ruthenium cis-diaqua bipyridyl complexes such as ruthenium cis diaqua bis (2,2'-bipyridyl-4,4'-dicarboxylate), porphyrins such as zinc tetra (4-carboxyphenyl) porphyrin, cyanides such as iron-hexacyanide complexes and phthalocyanines.

The photovoltaic module of the dye-sensitized solar cell is generally manufactured by assembling a front electrode made from an optically transparent conductive layer and a semiconductor photoactive layer, said semiconductor photoactive layer being coated with a dye layer, and filling the gap between the dye layer and a back electrode with the polymer electrolyte of the invention.

The polymer (F) is typically obtainable by polymerization of vinylidene fluoride (VDF) and at least one functional hydrogenated monomer [monomer $(H_F)$] comprising an end group of any of formulae (I) and (II):

—C(O)—O—$R_x$     (I)

—O—$R_x$     (II)

wherein $R_x$ is a hydrogen atom or a $C_1$-$C_5$ hydrocarbon group comprising at least one hydroxyl group.

The polymer (F) can be manufactured either by aqueous suspension polymerization or by aqueous emulsion polymerization.

The polymer (F) is preferably manufactured by aqueous emulsion polymerization of vinylidene fluoride (VDF), at least one monomer $(H_F)$ as defined above and, optionally, one or more other fluorinated monomers [monomers (F)] and/or hydrogenated monomers [monomers (H)], in the presence of at least one radical initiator, in a polymerization medium comprising:

water, at least one surfactant and optionally, at least one non-functional perfluoropolyether oil.

Polymerization pressure ranges typically between 10 bar and 45 bar, preferably between 15 bar and 40 bar, more preferably between 20 bar and 35 bar.

The skilled in the art will choose the polymerization temperature having regards, inter alia, of the radical initiator used. Polymerization temperature is generally selected in the range comprised between 80° C. and 140° C., preferably between 95° C. and 130° C.

Emulsion polymerization process as detailed above have been described in the art (see e.g. U.S. Pat. No. 4,990,283 (AUSIMONT SPA (IT)) 5 Feb. 1991, U.S. Pat. No. 5,498, 680 (AUSIMONT SPA) 12 Mar. 1996 and U.S. Pat. No. 6,103,843 (AUSIMONT SPA) 15 Aug. 2000).

The polymer (F) is advantageously a linear polymer [polymer $(F_L)$] comprising linear sequences of recurring units derived from vinylidene fluoride (VDF) and at least one monomer $(H_F)$.

The polymer (F) is thus typically distinguishable from graft polymers.

The polymer (F) is advantageously a random polymer [polymer $(F_R)$] comprising linear sequences of randomly distributed recurring units derived from vinylidene fluoride (VDF) and at least one monomer $(H_F)$.

The Applicant has found that the polymer $(F_R)$ advantageously maximizes the effect of the monomer $(H_F)$ on the crosslinking ability of the polymer (FC) thereby provided, even at low levels of monomer $(H_F)$ in the polymer $(F_R)$, without impairing the other outstanding properties of the polymer (F) such as thermal stability and mechanical properties.

The expression "randomly distributed recurring units" is intended to denote the percent ratio between the average number of monomer $(H_F)$ sequences (%), said sequences being comprised between two recurring units derived from VDF, and the total average number of recurring units derived from at least one monomer $(H_F)$ (%).

When each of the recurring units derived from at least one monomer $(H_F)$ is isolated, that is to say that a recurring unit derived from a monomer $(H_F)$ is comprised between two recurring units of VDF, the average number of monomer $(H_F)$ sequences equals the average total number of recurring units derived from at least one monomer $(H_F)$, so that the fraction of randomly distributed recurring units derived from at least one monomer (H F) is 100%: this value corresponds to a perfectly random distribution of recurring units derived from at least one monomer $(H_F)$. Thus, the larger is the number of isolated recurring units derived from at least one monomer $(H_F)$ with respect to the total number of recurring units derived from at least one monomer $(H_F)$, the higher will be the percentage value of fraction of randomly distributed recurring units derived from at least one monomer $(H_F)$.

The polymer (F) is thus typically distinguishable from block polymers.

The polymer (F) typically comprises at least 70% by moles, preferably at least 80% by moles, more preferably at least 90% by moles, with respect to the total moles of recurring units of said polymer (F), of recurring units derived from vinylidene fluoride (VDF).

The polymer (F) preferably comprises from 0.01% to 10% by moles, with respect to the total moles of recurring units of said polymer (F), of recurring units derived from at least one monomer $(H_F)$.

The polymer (F) may further comprise recurring units derived from at least one fluorinated monomer [monomer (F)] different from vinylidene fluoride (VDF).

By the term "fluorinated monomer [monomer (F)]" it is hereby intended to denote an ethylenically unsaturated monomer comprising at least one fluorine atom.

Non-limitative examples of suitable monomers (F) notably include the followings:
$C_2$-$C_8$ perfluoroolefins such as tetrafluoroethylene (TFE) and hexafluoropropylene (HFP);
perfluoroalkylethylenes of formula $CH_2$=$CH$—$R_{f0}$, wherein $R_{f0}$ is a $C_2$-$C_6$ perfluoroalkyl group;
chloro- and/or bromo- and/or iodo-$C_2$-$C_6$ fluoroolefins such as chlorotrifluoroethylene (CTFE);
perfluoroalkylvinylethers of formula $CF_2$=$CFOR_{f1}$, wherein $R_{f1}$ is a $C_1$-$C_6$ perfluoroalkyl group, such as perfluoromethylvinylether (PMVE) and perfluoropropylvinylether (PPVE);
(per)fluorooxyalkylvinylethers of formula $CF_2$=$CFOX_0$, wherein $X_0$ is a $C_1$-$C_{12}$ oxyalkyl group or a $C_1$-$C_{12}$ (per)fluorooxyalkyl group having one or more ether groups, e.g. perfluoro-2-propoxy-propyl group;
(vi) (per)fluoroalkylvinylethers of formula $CF_2$=$CFOCF_2OR_{f2}$, wherein $R_{f2}$ is a $C_1$-$C_6$ (per)fluoroalkyl group, e.g. —$CF_3$, —$C_2F_5$, —$C_3F_7$, or a $C_1$-$C_6$ (per)fluorooxyalkyl group having one or more ether groups, e.g. —$C_2F_5$—O—$CF_3$;
functional (per)fluorooxyalkylvinylethers of formula $CF_2$=$CFOY_0$, wherein $Y_0$ is selected from a $C_1$-$C_{12}$ alkyl group or (per)fluoroalkyl group, a $C_1$-$C_{12}$ oxyalkyl group and a $C_1$-$C_{12}$ (per)fluorooxyalkyl group having one or more ether groups, $Y_0$ comprising a carboxylic or sulfonic acid group, in its acid, acid halide or salt form;
fluorodioxoles, especially perfluorodioxoles.

Most preferred monomers (F) are chlorotrifluoroethylene (CTFE), perfluoromethylvinylether (PMVE), tetrafluoroethylene (TFE) and hexafluoropropylene (HFP).

Should at least one other monomer (F) be present, the polymer (F) of the invention comprises typically from 2% to 20% by moles, preferably from 3% to 18% by moles, more preferably from 4% to 15% by moles, with respect to the total moles of recurring units of said polymer (F), of recurring units derived from said monomer (F).

The polymer (F) may further comprise recurring units derived from at least one hydrogenated monomer [monomer (H)] different from the monomer $(H_F)$.

By the term "hydrogenated monomer [monomer (H)]" it is hereby intended to denote an ethylenically unsaturated monomer comprising at least one hydrogen atom and free from fluorine atoms.

The term "at least one fluorinated monomer [monomer (F)]" is understood to mean that the polymer (F) may comprise recurring units derived from one or more than one fluorinated monomers. In the rest of the text, the expression "fluorinated monomers" is understood, for the purposes of the present invention, both in the plural and the singular, that is to say that they denote both one or more than one fluorinated monomers as defined above.

The term "at least one hydrogenated monomer [monomer (H)]" is understood to mean that the polymer (F) may comprise recurring units derived from one or more than one hydrogenated monomers. In the rest of the text, the expression "hydrogenated monomers" is understood, for the purposes of the present invention, both in the plural and the singular, that is to say that they denote both one or more than one hydrogenated monomers as defined above.

The polymer (F) may be semi-crystalline or amorphous.

The term "semi-crystalline" is hereby intended to denote a polymer having a heat of fusion of from 10 to 90 J/g, preferably of from 30 to 60 J/g, more preferably of from 35 to 55 J/g as measured according to ASTM D3418-08.

The term "amorphous" is hereby to denote a polymer having a heat of fusion of less than 5 J/g, preferably of less than 3 J/g, more preferably of less than 2 J/g as measured according to ASTM D-3418-08.

The melt flow index (MFI) of the polymer (F) of the invention will be selected by the skilled in the art in relation to the processing technology selected for obtaining final parts (e.g. films or sheets).

It is nevertheless generally understood that the polymer (F) will have a MFI as measured according to ASTM D1238 (230° C., 5 Kg) advantageously comprised between 1 and 50 g/10 min, preferably between 2 and 30 g/10 min.

The skilled in the art will select the appropriate concentration of recurring units derived from the monomer $(H_F)$ in view of the crosslinking density required in the target field of use of the polymer (FC). It is nevertheless understood that appropriate crosslinking densities are advantageously obtained when the amount of recurring units derived from monomer ($H_F$) is preferably of at least 0.05% by moles, more preferably of at least 0.1% by moles, even more preferably of at least 0.5% by moles, still more preferably of at least 1% by moles, with respect to the total moles of recurring units of polymer (F).

It is also understood that the amount of recurring units derived from monomer ($H_F$) would be preferably of at most 8% by moles, more preferably of at most 7% by moles, even more preferably of at most 5% by moles, still more preferably of at most 3% by moles, with respect to the total moles of recurring units of polymer (F).

The monomer ($H_F$) is advantageously a monomer (H).

The monomer ($H_F$) is typically selected from the group consisting of (meth)acrylic monomers of formula (I-A) and vinyl ether monomers of formula (II-A):

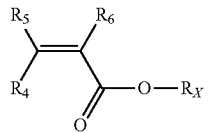
(I-A)

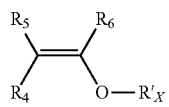
(II-A)

wherein each of $R_4$, $R_5$ and $R_6$, equal to or different from each other, is independently a hydrogen atom or a $C_1$-$C_3$ hydrocarbon group, $R_X$ is a hydrogen atom or a $C_1$-$C_5$ hydrocarbon group comprising at least one hydroxyl group, and $R'_X$ is a $C_1$-$C_5$ hydrocarbon group comprising at least one hydroxyl group.

The monomer ($H_F$) preferably complies with formula (I-A) as defined above.

The monomer ($H_F$) more preferably complies with formula (I-B):

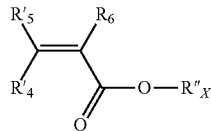
(I-B)

wherein $R'_4$ and $R'_5$ are hydrogen atoms, $R'_6$ is a hydrogen atom or a $C_1$-$C_3$ hydrocarbon group, and $R''_X$ is a hydrogen atom or a $C_1$-$C_5$ hydrocarbon group comprising at least one hydroxyl group.

Non limitative examples of monomers ($H_F$) of formula (I-A) include, notably, acrylic acid, methacrylic acid, hydroxyethyl(meth)acrylate, hydroxypropyl(meth)acrylate, hydroxyethylhexyl(meth)acrylate.

The monomer ($H_F$) is even more preferably selected from the followings:
acrylic acid (AA) of formula:

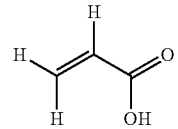

hydroxyethyl acrylate (HEA) of formula:

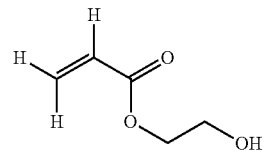

2-hydroxypropyl acrylate (HPA) of either of formulae:

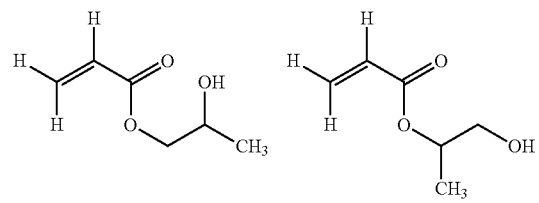

and mixtures thereof.

The (meth)acrylic compound [compound (MA)] is preferably of any of formulae (III') to (V'):

$R'_1R'_2C=C(R'_3)—C(O)—O-T'$ (III')

$R'_1R'_2C=C(R'_3)—C(O)—NH—C(O)—O-T'$ (IV')

$R'_1R'_2C=C(R'_3)—Z'—C(O)—O-T'$ (V')

wherein $R'_1$ and $R'_2$ are hydrogen atoms, $R'_3$ is a hydrogen atom or a $C_1$-$C_3$ hydrocarbon group, T' is a $C_1$-$C_{10}$ linear or branched hydrocarbon end group comprising at least one functional group comprising at least one heteroatom selected from the group consisting of oxygen, nitrogen and sulphur, and Z' is a bonding group of any of formulae (j) and (jj):

—NH—X—O—C(O)— (j), and

—NH—X—NHC(O)O—X'—O—C(O)— (jj)

wherein X and X', equal to or different from each other, are independently hydrocarbon groups selected from the group consisting of $C_1$-$C_{20}$ aliphatic groups, $C_5$-$C_{40}$ cycloaliphatic groups and $C_6$-$C_{50}$ aromatic, alkylaromatic or heteroaromatic groups.

The functional group in the end group T of the (meth) acrylic compound [compound (MA)] of any of formulae (III) to (V) is typically selected from the group consisting of hydroxyl groups, cyclic alkyl ether groups, isocyanate groups, carboxylic acid groups, amine groups, aryl ether groups and alkoxy silane groups.

The compound (MA) is more preferably selected from the group consisting of 2-hydroxy ethyl (meth)acrylate, 2-hydroxy propyl (meth)acrylate, 2-hydroxy butyl (meth)acrylate, 1-hydroxy butyl (meth)acrylate, glycidyl (meth)acrylate, 2-isocyanatoethyl (meth)acrylate, 2-hydroxy-3-phenyloxy propyl (meth)acrylate, 2-(2-ethoxyethoxy)ethyl (meth)acrylate, 2-phenoxy ethyl (meth)acrylate, phenoxy tetraethyleneglycol (meth)acrylate, (3-methacryloxypropyl)

trimethoxy silane, (3-methacryloxypropyl)dimethyl methoxy silane, and (3-acryloxypropyl)-trimethoxy silane.

The process for the manufacture of the crosslinkable fluoropolymer [polymer (FC)] is preferably carried out in a liquid medium comprising at least one organic solvent [solvent (S)].

The process for the manufacture of the crosslinkable fluoropolymer [polymer (FC)] is preferably carried out in the presence of at least one activating agent.

For the purpose of the present invention, the term "activating agent" is intended to denote a compound able to activate the reaction of at least one end group of any of formulae (I) and (II) of the polymer (F) and at least one compound (MA).

According to a first preferred embodiment of the process of the invention, the process comprises reacting at least one polymer (F), wherein the monomer ($H_F$) comprises an end group of formula (I), wherein $R_x$ is a hydrogen atom, and at least one compound (MA) of any of formulae (III) to (V), wherein T is a $C_1$-$C_{10}$ hydrocarbon end group comprising at least one functional group selected from the group consisting of hydroxyl groups, cyclic alkyl ether groups, preferably ethylene oxide groups, and amine groups, preferably primary amine groups.

According to a first variant of this first preferred embodiment of the invention, when the compound (MA) has any of formulae (III) to (V), wherein T is a $C_1$-$C_{10}$ hydrocarbon end group comprising at least one hydroxyl group, the process is typically carried out in the presence of at least one activating agent selected from the group consisting of N,N'-dicyclohexylcarbodiimide, thionyl chloride, oxalyl dichloride and inorganic acids.

According to a second variant of this first preferred embodiment of the invention, when the compound (MA) has any of formulae (III) to (V), wherein T is a $C_1$-$C_{10}$ hydrocarbon end group comprising at least one cyclic alkyl ether group, the process is typically carried out in the presence of at least one activating agent selected from the group consisting of alkyl ammonium halides.

According to a third variant of this first preferred embodiment of the invention, when the compound (MA) has any of formulae (III) to (V), wherein T is a $C_1$-$C_{10}$ hydrocarbon end group comprising at least one amine group, the process is typically carried out in the presence of at least one activating agent selected from the group consisting of thionyl chloride and oxalyl dichloride.

According to a second preferred embodiment of the process of the invention, the process comprises reacting at least one polymer (F), wherein the monomer ($H_F$) comprises an end group of any of formulae (I) and (II), wherein $R_x$ is a $C_1$-$C_5$ hydrocarbon group comprising at least one hydroxyl group, and at least one compound (MA) of any of formulae (III) to (V), wherein T is a $C_1$-$C_{10}$ hydrocarbon end group comprising at least one functional group selected from the group consisting of hydroxyl groups, cyclic alkyl ether groups, preferably ethylene oxide groups, isocyanate groups and carboxylic acid groups.

According to a first variant of this second preferred embodiment of the invention, when the compound (MA) has any of formulae (III) to (V), wherein T is a $C_1$-$C_{10}$ hydrocarbon end group comprising at least one hydroxyl group, the process is typically carried out in the presence of at least one activating agent selected from the group consisting of organic sulfonyl halides.

According to a second variant of this second preferred embodiment of the invention, when the compound (MA) has any of formulae (III) to (V), wherein T is a $C_1$-$C_{10}$ hydrocarbon end group comprising at least one cyclic alkyl ether group, the process is typically carried out in the presence of at least one activating agent selected from the group consisting of alkyl amines, preferably tertiary alkyl amines.

According to a third variant of this second preferred embodiment of the invention, when the compound (MA) has any of formulae (III) to (V), wherein T is a $C_1$-$C_{10}$ hydrocarbon end group comprising at least one isocyanate group, the process is typically carried out in the presence of at least one activating agent selected from the group consisting of organic tin compounds.

According to a fourth variant of this second preferred embodiment of the invention, when the compound (MA) has any of formulae (III) to (V), wherein T is a $C_1$-$C_{10}$ hydrocarbon end group comprising at least one carboxylic acid group, the process is typically carried out in the presence of at least one activating agent selected from the group consisting of inorganic acids.

The crosslinkable fluoropolymer [polymer (FC)] of the invention preferably comprises recurring units derived from vinylidene fluoride (VDF) and at least one functional hydrogenated monomer [monomer ($H'_F$)] comprising a pendant side chain of any of formulae (VI) to (X):

—C(O)—O—Y-E (VI)

—C(O)—NH—Y-E (VII)

—[C(O)]$_n$—O—R—O—Y-E (VIII)

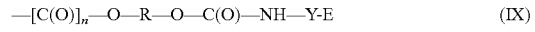

—[C(O)]$_n$—O—R—O—C(O)—NH—Y-E (IX)

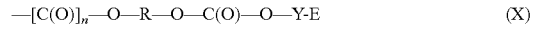

—[C(O)]$_n$—O—R—O—C(O)—O—Y-E (X)

wherein Y is a $C_1$-$C_{10}$ hydrocarbon bonding group, optionally comprising at least one functional group, R is a $C_1$-$C_5$ hydrocarbon group, optionally comprising at least one hydroxyl group, n is 0 or 1, and E is an end group of any of formulae (III-A) to (V-A):

—O—C(O)—C($R_3$)=C$R_1R_2$ (III-A)

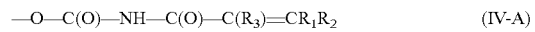

—O—C(O)—NH—C(O)—C($R_3$)=C$R_1R_2$ (IV-A)

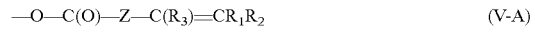

—O—C(O)—Z—C($R_3$)=C$R_1R_2$ (V-A)

wherein each of $R_1$, $R_2$ and $R_3$, equal to or different from each other, is independently a hydrogen atom or a $C_1$-$C_3$ hydrocarbon group, and Z is a functional group of any of formulae (j) and (jj):

—NH—X—O—C(O)— (j), and

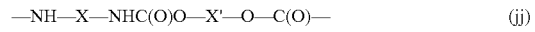

—NH—X—NHC(O)O—X'—O—C(O)— (jj)

wherein X and X', equal to or different from each other, are independently hydrocarbon groups selected from the group consisting of $C_1$-$C_{20}$ aliphatic groups, $C_5$-$C_{40}$ cycloaliphatic groups and $C_6$-$C_{50}$ aromatic, alkylaromatic or heteroaromatic groups.

Non-limitative examples of suitable functional groups in the bonding group Y of the pendant side chain of any of formulae (VI) to (X) include, notably, hydroxyl groups, cyclic alkyl ether groups, isocyanate groups, carboxylic acid groups, amine groups, aryl ether groups and alkoxy silane groups.

The crosslinkable fluoropolymer [polymer (FC)] of the invention more preferably comprises recurring units derived from vinylidene fluoride (VDF) and at least one functional hydrogenated monomer [monomer ($H'_F$)] comprising a pendant side chain of any of formulae (VI') to (X'):

—C(O)—O—Y'-E'  (VI')

—C(O)—NH—Y'-E'  (VII')

—[C(O)]$_{n'}$—O—R'—O—Y'-E'  (VIII')

—[C(O)]$_{n'}$—O—R'—O—C(O)—NH—Y'-E'  (IX')

—[C(O)]$_{n'}$—O—R'—O—C(O)—O—Y'-E'  (X')

wherein Y' is a $C_1$-$C_{10}$ linear or branched hydrocarbon bonding group, optionally comprising at least one functional group, R' is a $C_1$-$C_5$ hydrocarbon group, optionally comprising at least one hydroxyl group, n' is 0 or 1, and E' is an end group of any of formulae (III'-A) to (V'-A):

—O—C(O)—C(R'$_3$)=CR'$_1$R'$_2$  (III'-A)

—O—C(O)—NH—C(O)—C(R'$_3$)=CR'$_1$R$_2$  (IV'-A)

—O—C(O)—Z'—C(R'$_3$)=CR'$_1$R$_2$  (V'-A)

wherein R'$_1$ and R'$_2$ are hydrogen atoms, R'$_3$ is a hydrogen atom or a $C_1$-$C_3$ hydrocarbon group, and Z' is a bonding group of any of formulae (j) and (jj):

—NH—X—O—C(O)—  (j), and

—NH—X—NHC(O)O—X'—O—C(O)—  (jj)

wherein X and X', equal to or different from each other, are independently hydrocarbon groups selected from the group consisting of $C_1$-$C_{20}$ aliphatic groups, $C_5$-$C_{40}$ cycloaliphatic groups and $C_6$-$C_{50}$ aromatic, alkylaromatic or heteroaromatic groups.

The crosslinkable fluoropolymer [polymer (FC)] of the invention even more preferably comprises:
recurring units derived from vinylidene fluoride (VDF), and
from 0.01% to 10% by moles, with respect to the total moles of recurring units of said polymer (FC), of recurring units derived from at least one monomer (H'$_F$).

The polymer (FC) typically comprises at least 70% by moles, preferably at least 80% by moles, more preferably at least 90% by moles, with respect to the total moles of recurring units of said polymer (FC), of recurring units derived from vinylidene fluoride (VDF).

The polymer (FC) comprises recurring units derived from at least one monomer (H'$_F$) in an amount preferably of at least 0.05% by moles, more preferably of at least 0.1% by moles, even more preferably of at least 0.5% by moles, still more preferably of at least 1% by moles, with respect to the total moles of recurring units of said polymer (FC).

The polymer (FC) comprises recurring units derived from at least one monomer (H'$_F$) in an amount preferably of at most 8% by moles, more preferably of at most 7% by moles, even more preferably of at most 5% by moles, still more preferably of at most 3% by moles, with respect to the total moles of recurring units of said polymer (FC).

The polymer (FC) may further comprise recurring units derived from at least one fluorinated monomer [monomer (F)] different from vinylidene fluoride (VDF).

Should at least one other monomer (F) be present, the polymer (FC) of the invention comprises typically from 2% to 20% by moles, preferably from 3% to 18% by moles, more preferably from 4% to 15% by moles, with respect to the total moles of recurring units of said polymer (FC), of recurring units derived from said monomer (F).

The polymer (FC) may further comprise recurring units derived from at least one hydrogenated monomer [monomer (H)] different from the monomer (H'$_F$).

The polymer (FC) obtainable by the process of the invention is typically recovered and then dried.

Drying can be performed under modified atmosphere, e.g. under an inert gas, typically exempt notably from moisture (water vapour content of less than 0.001% v/v), or can be performed under vacuum.

Drying can be performed at room temperature (about 25° C.) or at a temperature exceeding 25° C., this latter condition being generally preferred.

It is understood that, under drying conditions, the low molecular weight side products generated by reaction of at least one polymer (F) and at least one compound (MA), which can be notably water or alcohols as a function of the nature of the compound (MA), are at least partially removed from the polymer (FC), possibly further promoting, by combined action of heat and side products removal, additional reaction of said at least one polymer (F) and said at least one compound (MA).

The skilled in the art will select the drying temperature having regards, inter alia, of not causing the polymer (FC) to crosslink.

While the polymer (FC) may advantageously undergo self-crosslinking, that is to say that it can be cured in the absence of any additional crosslinking co-agent and/or crosslinking initiator, it is generally preferred to use a crosslinkable composition [composition (CC)] comprising:
at least one crosslinkable fluoropolymer [polymer (FC)], and
at least one additive selected from the group consisting of crosslinking co-agents and crosslinking initiators.

The crosslinking co-agent is typically a poly(meth)acrylic compound [compound (PMA)] comprising at least two end groups of formula (XI):

—O—C(O)—C(R$_7$)=CR$_8$R$_9$  (XI)

wherein each of $R_7$, $R_8$ and $R_9$, equal to or different from each other, is independently a hydrogen atom or a $C_1$-$C_3$ hydrocarbon groups.

The compound (PMA) preferably comprises at most six end groups of formula (XI) as defined above.

The compound (PMA) is more preferably selected from the group consisting of ethylene glycol di(meth)acrylate, diethylene glycol di(meth)acrylate, triethylene glycol di(meth)acrylate, tetraethylene glycol di(meth)acrylate, polyethylene glycol di(meth)acrylate, 1,6-hexanediol di(meth)acrylate, 1,3-butylene glycol di(meth)acrylate, tripropylene glycol di(meth)acrylate, ethoxylated bisphenol A di(meth)acrylate, cyclohexane dimethanol di(meth)acrylate, tris[2-(acryloyloxy)ethyl]isocyanurate, trimethylol propane triacrylate, ethylene oxide added trimethylol propane triacrylate, pentaerythritol triacrylate, tris(acrylooxyethyl) isocyanurate, dipentaerythritol hexaacrylate and caprolactone denatured dipentaerythritol hexaacrylate.

The crosslinking initiator may be a photoinitiator [initiator (PI)] or a thermal initiator [initiator (TI)].

The dose of the UV radiation will be adjusted by the skilled in the art as a function of the type and concentration of the photoinitiator [initiator (PI)]; generally, good results have been obtained with radiation doses of at least 2 J/cm$^2$, preferably of at least 5 J/cm$^2$.

For achieving improved curing rates and minimizing degradation reactions, the crosslinkable fluoropolymer film [film (FC)] may be submitted to a UV radiation under a substantially oxygen-free atmosphere. Typically, UV treatment is carried out under nitrogen atmosphere.

The photoinitiator [initiator (PI)] is typically selected from the group consisting of alpha-hydroxyketones, phenylglyoxylates, benzyldimethyl-ketals, alpha-aminoketones and bis acyl-phosphines.

Among alpha-hydroxyketones, mention can be made of
1-hydroxy-cyclohexyl-phenyl-ketone,
2-hydroxy-2-methyl-1-phenyl-1-propanone, and
2-hydroxy-1-[4-(2-hydroxyethoxy)phenyl]-2-methyl-1-propanone.

Among phenylglyoxylates, mention can be made of methylbenzoylformate, oxy-phenyl-acetic acid 2-[2-oxo-2-phenyl-acetoxy-ethoxy]-ethyl ester, and oxy-phenyl-acetic 2-[2-hydroxy-ethoxy]-ethyl ester.

Among benzyldimethyl-ketals, mention can be made of alpha, alpha-dimethoxy-alpha-phenylacetophenone.

Among alpha-aminoketones, mention can be made of
2-benzyl-2-(dimethylamino)-1-[4-(4-morpholinyl) phenyl]-1-butanone, and
2-methyl-1-[4-(methylthio)phenyl]-2-(4-morpholinyl)-1-propanone.

Among bis acyl-phosphines, mention can be made of diphenyl-(2,4,6-trimethylbenzoyl)-phosphine oxide.

Among initiators (PI), those which are liquid at room temperature are preferred.

A class of initiators (PI) which gave particularly good results has been that of alpha-hydroxyketones, in particular 2-hydroxy-2-methylpropylphenone.

The amount of initiator (PI) in the composition (CC) is not particularly limited. It will be generally used in an amount comprised between 0.01% and 10% by weight, with respect to the total weight of the composition (CC). According to an embodiment of the invention, the composition (CC) comprises at least one initiator (PI) in an amount comprised between 3% and 7% by weight, with respect to the total weight of the composition (CC).

The thermal initiator [initiator (TI)] is typically selected from the group consisting of organic peroxides.

The composition (CC) might possibly comprise further additives and ingredients, provided that they do not interfere with light transmission.

Should the disclosure of any patents, patent applications, and publications which are incorporated herein by reference conflict with the description of the present application to the extent that it may render a term unclear, the present description shall take precedence.

The invention will be now described in more detail with reference to the following examples whose purpose is merely illustrative and not limitative of the scope of the invention.

Raw Materials
VDF-HEA polymer containing 0.70% by moles of HEA [polymer (F-1)]
VDF-AA polymer containing 0.70% by moles of AA [polymer (F-2)]

Determination of Total Average Monomer ($H_F$) Content

Total average monomer ($H_F$) content in polymers (F) was determined by acid-base titration. A sample of 1.0 g of fluoropolymer was dissolved in acetone at a temperature of about 70° C. 5 ml of water was added thereto drop wise under vigorous stirring so as to avoid coagulation of the polymer. Titration with aqueous NaOH having a concentration of 0.01 N until complete neutralization of acidity was then carried out, with neutrality transition at about −170 mV.

EXAMPLE 1

Manufacture of a Crosslinkable Fluoropolymer [Polymer (FC-1)]

The polymer (F-1) (25 g) having EW of 9280 g/eq (2.7 meq. —CH$_2$CH$_2$OH; 10.8 acrylate chains/100000 g/mole) was dissolved in 350 ml of methyl ethyl ketone at 85° C. and placed in a previously flame-dried 3-necked round-bottomed flask equipped with a reflux condenser, a dripping funnel, a thermometer and a mechanical stirrer. The solution was heated to 75° C. and then 2-isocyanatoethyl methacrylate (420 mg, 2.7 mmol free —NCO) and a catalytic amount (0.1 mol % vs. free —NCO) of di-tert-butyl tin bislaurate (previously dissolved in 10 ml methyl ethyl ketone) were dripped thereto in 1 minute. A clear homogeneous solution was obtained which was stirred at 75° C. and 800 rpm for 15 hours. The progress of the reaction was monitored by FT-IR quantitatively measuring the residual —NCO groups. Once the conversion was completed, the crude mixture was poured in 1 lt. of distilled H$_2$O. The polymer precipitated as a white solid. The polymer so obtained was then washed with an additional 2 lt. of distilled H$_2$O on a Büchner funnel. The polymer was finally dried in a heating oven at 60° C. and 20 mm Hg residual pressure for 5 hours thereby providing 24.1 g of a powdery, white solid.

Conversion (of starting acrylate co-monomer): 96.6% by moles based on FT-IR measurements.

Active sites: 10.4 acrylate sites/100000 g/mol of polymer (FC-1).

EW: 9430 g/eq.
Urethane-acrylate modification: 2.78% w/w
Isolated yield: 95%.

EXAMPLE 2

Manufacture of a Crosslinkable Fluoropolymer [Polymer (FC-2)]

The polymer (F-2) (2.0 g) having EW of 9259 g/eq (0.216 meq —COOH; 8 acrylate chains/100000 g/mole) was dissolved in 20 ml of ethyl acetate in a 250 ml 4-necked glass reaction flask equipped with a magnetic stirrer, a condenser, a thermometer and a dripping funnel. The reactor was placed in an inert atmosphere (N$_2$) with vigorous stirring and heated to 55° C. until the polymer (F-2) was completely dissolved. The reactor was then cooled to 20° C. and a mixture of thionyl chloride (0.256 g, 2.16 mmols) and pyridine (17 µl, 0.216 mmols) in ethyl acetate (5 ml) was dripped thereto in 10 minutes. The mixture was then heated to 75° C. with vigorous stirring for 3 hours under an inert atmosphere (N$_2$), following the conversion of PVDF's carboxylic groups to acyl chloride groups by measuring the volume of HCl gas evolved employing a micro-gas collector. Once the conversion was completed, the crude mixture so obtained was filtered under pressure on a 0.2 µm PFPE membrane so as to remove side-products and then evaporated in a rotary evaporator at 70° C. and 100 mm Hg residual pressure. The evaporated solid was dissolved in 15 ml of ethyl acetate and heated to 75° C. with vigorous stirring for 3 hours under an inert atmosphere (N$_2$). A mixture of hydroxy propyl acrylate isomers (0.28 g, 2.16 mmol) dissolved in 2 ml of ethyl acetate was dripped thereto in about 5 minutes. Once HCl evolution stopped, the crude mixture was stirred at 75° C. for additional 5 hours. The crude polymer mixture was then evaporated at 70° C. and 18 mm Hg of residual pressure. The solid polymer obtained was finally washed with ethyl acetate and CH$_2$Cl$_2$ and dried in a vacuum oven at 65° C. for 4 hours thereby providing 1.66 g of a pale-yellow, powdery polymer.

Conversion (of starting acrylic co-monomer): 60% by moles.
Isolated yield: 83%
EW: 9401 g/eq.
Active sites: 6.5 acrylate sites/100000 g/mol
Urethane-acrylate modification: 1.67% w/w

COMPARATIVE EXAMPLE 1

The polymer (F-1) (0.5 g) was dissolved in 20 ml of ethyl acetate at 20° C. The mixture was placed in a Petri dish to which 50 ml of a 10% v/v solution of methylene-4-4'biscyclohexylisocyanate (0.02 mmol, 0.04 meq —NCO) and 10 ml of a 2% solution of di-tert-butyl tin bislaurate as catalyst were added. The mixture so obtained was heated in an oven at 55° C. for 3 hours at atmospheric pressure. Following the thermal reaction, the solvent was evaporated and a film made from a crosslinked polymer with covalent urethane bonds was recovered from the Petri dish by adding 10 ml of distilled H$_2$O. The wet film was dried in a vacuum oven at 50° C. and 10 mm Hg residual pressure. The film thereby provided was not soluble in ethyl acetate and other solvents such as acetone in which the polymers (F-1) was soluble, thus confirming that the polymer forming the film is suitably crosslinked.

Manufacture of Films and Crosslinking Thereof Using Polymers (FC-1) and (FC-2) of Examples 1 and 2

Specimens of any of the polymers obtained according to Examples 1 and 2 were dissolved in a mixture containing triethyl phosphate, propylene glycol monomethyl ether acetate and cyclopentanone so as to provide, after 3 hours of stirring at a temperature of 40° C., solutions having a concentration of 10% by weight.

(A) Spin Coating

The solutions so obtained were loaded into a Laurell WS-650 LITE SERIES spin coater and spin-coated at a speed of 2000 rpm onto silicon wafer substrates in order to obtain very thin polymeric layers on silicon wafer as substrate. The polymer layers so obtained were dried at 85° C. for 20 minutes. For each example, two polymeric films on silicon wafer were prepared.

The samples thereby obtained were all homogeneous. The thickness of the samples has been measured using a Filmetrics F20 unit.

(B) Crosslinking

The polymer films so obtained were submitted to crosslinking either by UV treatment or by thermal treatment.

Thermal treatment consisted in maintaining samples of films so obtained in a ventilated oven at a temperature of about 125° C. for 20 minutes.

For UV treatment, samples of films obtained according to procedure (A) but using a composition comprising any of the polymers obtained according to Examples 1 and 2 and at least one additive selected from the group consisting of crosslinking initiators were passed through a semi-automatic crosslinker device based on a UV lamp and equipped with a moving belt carrying the samples for 30 seconds equivalent to 3 steps of 10 seconds each.

The crosslinking initiator was selected from the group consisting of photoinitiators (PI).

(C) Chemical Resistance Test

In order to verify if the samples were crosslinked, pure acetone was poured on the films after crosslinking treatment: insolubility in such conditions was considered to be a clear evidence of suitable crosslinking.

Results are summarized in Table 1 here below.

TABLE 1

| Film | Solubility in acetone before treatment | UV treatment | Thermal treatment |
|---|---|---|---|
| Ex. 1 | soluble | insoluble | insoluble |
| Ex. 1 + PI | soluble | insoluble | insoluble |
| Ex. 2 | soluble | insoluble | insoluble |
| Ex. 2 + PI | soluble | insoluble | insoluble |
| Polymer (F-1) | soluble | soluble | soluble |
| Polymer (F-2) | soluble | soluble | soluble |

Results in Table 1 here above well demonstrate that polymers (FC) according to the invention such as those obtained according to Examples 1 and 2 are effective in crosslinking either by UV treatment or by thermal treatment to the same extent as the crosslinked polymer obtained according to Comparative Example 1. On the contrary, VDF-HEA and VDF-AA polymers, said polymers being free from (meth)acrylic end groups, do not undergo crosslinking.

The invention claimed is:

1. A crosslinkable fluoropolymer [polymer (FC)] comprising:
   first recurring units derived from vinylidene fluoride (VDF), and
   from 0.01% to 10% by moles, with respect to the total moles of recurring units of said polymer (FC), of second recurring units derived from at least one functional hydrogenated monomer (H'$_F$), said second recurring units comprising a pendant side chain comprising an end group (E) of any of formulae (III-A) to (V-A):

   —O—C(O)—C(R$_3$)=CR$_1$R$_2$     (III-A)

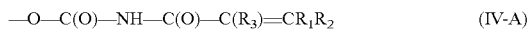
   —O—C(O)—NH—C(O)—C(R$_3$)=CR$_1$R$_2$     (IV-A)

   —O—C(O)—Z—C(R$_3$)=CR$_1$R$_2$     (V-A)

wherein each of R$_1$, R$_2$ and R$_3$ equal to or different from each other, is independently a hydrogen atom or a C$_1$-C$_3$ hydrocarbon group, and Z is a bonding group of any of formulae (j) and (jj):

   —NH—X—O—C(O)—     (j), and

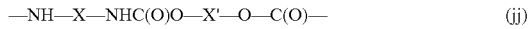
   —NH—X—NHC(O)O—X'—O—C(O)—     (jj)

wherein X and X', equal to or different from each other, are independently hydrocarbon groups selected from the group consisting of C$_1$-C$_{20}$ aliphatic groups, C$_5$-C$_{40}$ cycloaliphatic groups and C$_6$-C$_{50}$ aromatic, alkylaromatic and heteroaromatic groups.

2. The crosslinkable fluoropolymer [polymer (FC)] according to claim 1, wherein the pendent side chain of at least one monomer (H'$_F$) is a pendant side chain of any of formulae (VI) to (X):

   —C(O)—O—Y—E     (VI)

   —C(O)—NH—Y—E     (VII)

   —[C(O)]$_n$—O—R—O—Y—E     (VIII)

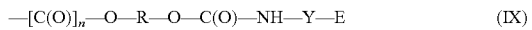
   —[C(O)]$_n$—O—R—O—C(O)—NH—Y—E     (IX)

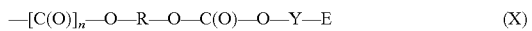
   —[C(O)]$_n$—O—R—O—C(O)—O—Y—E     (X)

wherein Y is a C$_1$-C$_{10}$ hydrocarbon bonding group, optionally comprising at least one functional group, R is a C$_1$-

$C_5$ hydrocarbon group, optionally comprising at least one hydroxyl group, n is 0 or 1, and E is an end group of any of formulae (III-A) to (V-A).

3. A process for the manufacture of the crosslinkable fluoropolymer [polymer (FC)] according to claim 1, said process comprising reacting:
(A) at least one fluoropolymer [polymer (F)] comprising:
first recurring units derived from vinylidene fluoride (VDF), and
from 0.01% to 10% by moles, with respect to the total moles of recurring units of said polymer (F), of second recurring units derived from at least one functional hydrogenated monomer ($H_F$), said second recurring units comprising a pendant side chain comprising an end group of any of formulae (I) and (II):

—C(O)—O—$R_x$        (I)

—O—$R_x$        (II)

wherein $R_x$ is a hydrogen atom or a $C_1$-$C_5$ hydrocarbon group comprising at least one hydroxyl group, and
(B) at least one (meth)acrylic compound (MA) of any of formulae (III) to (V):

$R_1R_2C{=}C(R_3)$—C(O)—O—T        (III)

$R_1R_2C{=}C(R_3)$—C(O)—NH—C(O)—O—T        (IV)

$R_1R_2C{=}C(R_3)$—Z—C(O)—O—T        (V)

wherein each of $R_1$, $R_2$ and $R_3$, equal to or different from each other, is independently a hydrogen atom or a $C_1$-$C_3$ hydrocarbon group, T is a $C_1$-$C_{10}$ hydrocarbon end group comprising at least one functional group, and Z is a bonding group of any of formulae (j) and (jj):

—NH—X—O—C(O)—        (j), and

—NH—X—NHC(O)O—X'—O—C(O)—        (jj)

wherein X and X', equal to or different from each other, are independently hydrocarbon groups selected from the group consisting of $C_1$-$C_{20}$ aliphatic groups, $C_5$-$C_{40}$ cycloaliphatic groups and $C_6$-$C_{50}$ aromatic, alkylaromatic and heteroaromatic groups.

4. The process according to claim 3, wherein monomer ($H_F$) is selected from the group consisting of (meth)acrylic monomers of formula (I-A) and vinyl ether monomers of formula (II-A):

(I-A)

(II-A)

wherein each of $R_4$, $R_5$ and $R_6$, equal to or different from each other, is independently a hydrogen atom or a $C_1$-$C_3$ hydrocarbon group, $R_X$ is a hydrogen atom or a $C_1$-$C_5$ hydrocarbon group comprising at least one hydroxyl group, and $R'_x$ is a $C_1$-$C_5$ hydrocarbon group comprising at least one hydroxyl group.

5. The process according to claim 3, wherein T is a $C_1$-$C_{10}$ hydrocarbon end group comprising at least one functional group selected from the group consisting of hydroxyl groups, cyclic alkyl ether groups, isocyanate groups, carboxylic acid groups, amine groups, aryl ether groups and alkoxy silane groups.

6. The process according to claim 3, said process being carried out in a liquid medium comprising at least one organic solvent (S).

7. The process according to claim 3, wherein monomer ($H_F$) comprises an end group of formula (I), wherein $R_x$ is a hydrogen atom, and compound (MA) has any of formulae (III) to (V), wherein T is a $C_1$-$C_{10}$ hydrocarbon end group comprising at least one functional group selected from the group consisting of hydroxyl groups, cyclic alkyl ether groups, and amine groups.

8. The process according to claim 7, wherein compound (MA) has any of formulae (III) to (V), wherein T is a $C_1$-$C_{10}$ hydrocarbon end group comprising at least one hydroxyl group, said process being carried out in the presence of at least one activating agent selected from the group consisting of N,N'-dicyclohexylcarbodiimide, thionyl chloride, oxalyl dichloride and inorganic acids.

9. The process according to claim 3, wherein monomer ($H_F$) comprises an end group of any of formulae (I) and (II), wherein $R_x$ is a $C_1$-$C_5$ hydrocarbon group comprising at least one hydroxyl group, and compound (MA) has any of formulae (III) to (V), wherein T is a $C_1$-$C_{10}$ hydrocarbon end group comprising at least one functional group selected from the group consisting of hydroxyl groups, cyclic alkyl ether groups, isocyanate groups and carboxylic acid groups.

10. The process according to claim 9, wherein compound (MA) has any of formulae (III) to (V), wherein T is a $C_1$-$C_{10}$ hydrocarbon end group comprising at least one isocyanate group, said process being carried out in the presence of at least one activating agent selected from the group consisting of organic tin compounds.

11. A crosslinkable composition (CC) comprising:
at least one crosslinkable fluoropolymer [polymer (FC)] according to claim 1, and
at least one additive selected from the group consisting of crosslinking co-agents and crosslinking initiators.

12. A crosslinkable fluoropolymer film [film (FC)] comprising at least one crosslinkable fluoropolymer [polymer (FC)] according to claim 1.

13. The crosslinkable fluoropolymer film [film (FC)] according to claim 12, said film (FC) being free from any organic solvent (S).

14. The crosslinkable fluoropolymer film [film (FC)] according to claim 12, said film (FC) further comprising at least one organic solvent (S).

15. The film (FC) according to claim 14, wherein the solvent (S) is selected from the group consisting of diesters of formula (DE-I) and ester-amides of formula (EA-I):

$R_A$—OOC—$Z_{de}$—COO—$R_B$        (DE-I)

$R_A$—OOC—$Z_{ea}$—CO—$NR_CR_D$        (EA-I)

wherein:
$R_A$ and $R_B$, equal to or different from each other, are independently selected from the group consisting of $C_1$-$C_{20}$ hydrocarbon groups,
$R_C$ and $R_D$, equal to or different from each other, are independently selected from the group consisting of hydrogen, $C_1$-$C_{36}$ hydrocarbon groups, optionally substituted, wherein $R_C$ and $R_D$ are optionally part of a cyclic moiety including the nitrogen atom to which they are bound, said cyclic moiety being optionally substituted and/or optionally comprising one or more than one additional heteroatom, and mixtures thereof, and $Z_{de}$ and $Z_{ea}$, equal to or different from each other, are independently a linear or branched $C_3$-$C_{10}$ divalent alkylene group.

16. The crosslinkable fluoropolymer film [film (FC)] according to claim 14, said film (FC) further comprising at least one electrolytic salt.

17. A process for the manufacture of a crosslinked fluoropolymer film [film (FCC)], said process comprising crosslinking, either by UV treatment under UV radiation or by thermal treatment, the crosslinkable fluoropolymer film [film (FC)] according to claim 12.

18. A crosslinked fluoropolymer film [film (FCC)] obtainable by the process according to claim 17, said film (FCC) comprising at least one crosslinked fluoropolymer [polymer (FCC)].

19. A solar cell module comprising the crosslinked fluoropolymer film [film (FCC)] according to claim 18.

20. An electrochemical device comprising a polymer electrolyte which comprises the crosslinked fluoropolymer film [film (FCC)] obtainable by the process according to claim 17, said process comprising crosslinking, either by UV treatment under UV radiation or by thermal treatment, a crosslinkable fluoropolymer film [film (FC)] that further comprises at least one electrolytic salt.

* * * * *